Figure 1:
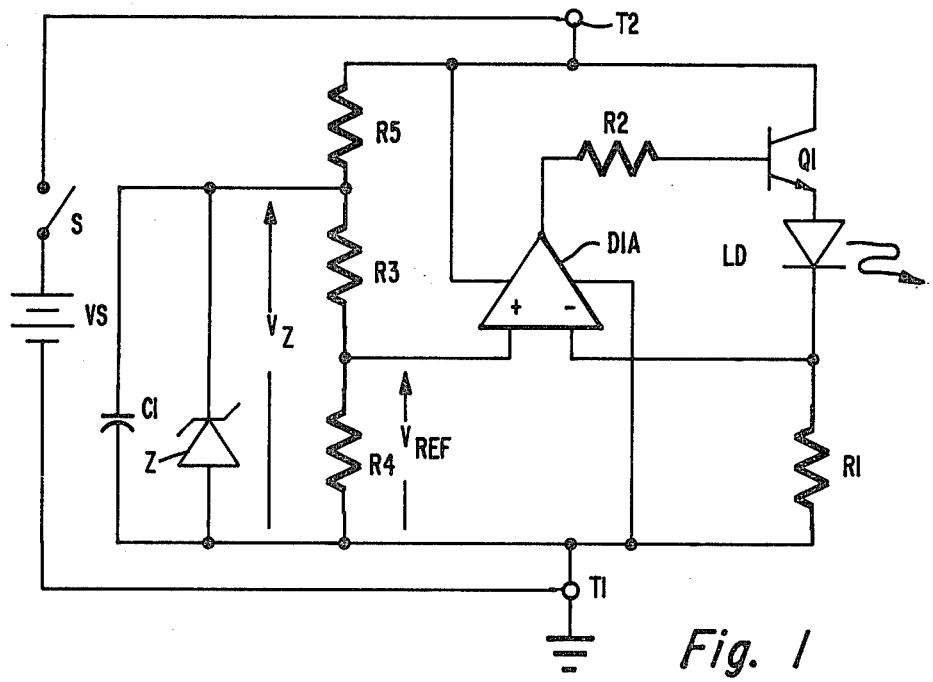

United States Patent [19]

Miller

[11] Patent Number: 4,484,331
[45] Date of Patent: Nov. 20, 1984

[54] REGULATOR FOR BIAS CURRENT OF SEMICONDUCTOR LASER DIODE

[75] Inventor: Richard D. Miller, Lancaster, Pa.

[73] Assignee: RCA Corporation, New York, N.Y.

[21] Appl. No.: 572,955

[22] Filed: Jan. 23, 1984

Related U.S. Application Data

[63] Continuation of Ser. No. 284,554, Jul. 20, 1981.

[51] Int. Cl.³ .............................................. H01S 3/00
[52] U.S. Cl. ..................................... 372/38; 372/29; 372/33; 372/34; 372/44; 307/311
[58] Field of Search ..................... 372/33, 38, 29, 34, 372/44; 307/285, 311, 270

[56] References Cited

U.S. PATENT DOCUMENTS

| | | | |
|---|---|---|---|
| 3,705,316 | 12/1972 | Burrous et al. | 307/311 |
| 3,946,335 | 3/1976 | de Loach, Jr. et al. | 331/94.5 |
| 4,009,385 | 2/1977 | Sell | 372/38 |
| 4,084,670 | 3/1978 | Albanese | 372/38 |
| 4,109,217 | 8/1978 | Brackett et al. | 331/94.5 |
| 4,121,122 | 10/1978 | Pokrandt | 307/311 |
| 4,198,675 | 4/1980 | Moore | 364/525 |
| 4,237,427 | 12/1980 | Holland | 372/29 |
| 4,243,951 | 1/1981 | Wolkstein et al. | 331/94.5 M |
| 4,243,952 | 1/1981 | Patterson | 331/94.5 S |
| 4,355,395 | 10/1982 | Salter et al. | 372/38 |

FOREIGN PATENT DOCUMENTS 2045516  10/1980  United Kingdom .

OTHER PUBLICATIONS

A. Albanese, Automatic Bias Control (ABC) for Injection Laser, Topical Meeting on Optical Fiber Transmission II, Feb. 1977.
Wittke, et al., Stabilization of CW Injection Lasers, RCA TN 1005, Apr. 1975.

Primary Examiner—William L. Sikes
Assistant Examiner—Léon Scott, Jr.
Attorney, Agent, or Firm—Joseph S. Tripoli; George E. Haas; Allen LeRoy Limberg

[57] ABSTRACT

Current regulator circuits using electrical feedback to stabilize the bias currents of semiconductor laser diodes are disclosed. In these electrical feedback circuits laser diode current is sensed with negative-temperature-coefficient resistance to develop voltages which are compared to zero-temperature-coefficient voltages for generating error signals, and these error signals regulate the emission from the laser diode against changes with temperature.

2 Claims, 3 Drawing Figures

REGULATOR FOR BIAS CURRENT OF SEMICONDUCTOR LASER DIODE

This is a continuation of application Ser. No. 284554, filed 20 July 1981.

The invention relates to the stabilization of the bias currents of semiconductor laser diodes operated to emit coherent light, which stabilization methods employ electrical rather than optical feedback.

It is desirable to avoid the use of optical feedback, particularly where light output from both facets of an injection laser diode is to be used, in order not to have to divert a portion of the light output of the laser to the optical sensing device that would be used in an optical feedback system. A substantial current level must be passed through the laser diode in order that the junction voltage reach a value where it no longer increases appreciably with increased current flow. Light is emitted by the laser at higher current levels. The region of laser diode operation where an appreciable amount of coherent light is emitted is at current levels ten times as large or so as the current level at which the junction voltage no longer increases. A threshold current is reached after which small percentage increase in laser diode current level—say, 5%—results in doubling or tripling of the optical power emitted by the laser diode. This can result in cumulative damage to the laser diode facet that drastically reduces laser diode life. The operation described presumes the laser diode is operated at constant value of temperature, the laser diode requiring increased bias current for increasing operating temperature in order to maintain constant optical power output. Consequently, apparatus using electrical feedback to control laser diode bias current has to perform to exacting specifications.

A. Albanese in a paper entitled AUTOMATIC BIAS CONTROL (ABC) FOR INJECTION LASERS presented Topical Meeting on Optical Fiber Transmission II held in Williamsburg, VA, USA on 22–24 February 1977 described a feedback system the operation of which is based on the fact that changes in laser current cause appreciable changes in voltage drop across the laser only below a certain voltage. The error signal for the feedback system is developed responsive to voltage changes across the laser diode. The feedback system is appropriate then only for modulated operation of the laser and not for continuous-wave (CW) operation insofar as presently commercial laser diodes are concerned.

The invention is embodied in a connection of the laser diode to receive regulated current of the following type. Means are provided for supplying operating voltage between first and second terminals. A current sensing resistance has a first end connected at the first terminal and has a second end connected to the second terminal through the series connection of the laser diode poled for forward conduction and the principal current conduction path of a transistor. A differential-input amplifier has an output connection to the control electrode of the transistor and has the second end of the current sensing resistor connected to the one of its inverting and non-inverting input connection which makes the resulting feedback loop degenerative in nature, so that current through the sensing resistor and the series connection including the laser diode are regulated to a prescribed value. This value is equal to a potential applied between the first terminal and the other of the input connections of the differential-input amplifier, divided by said current sensing resistance.

Figure 2:
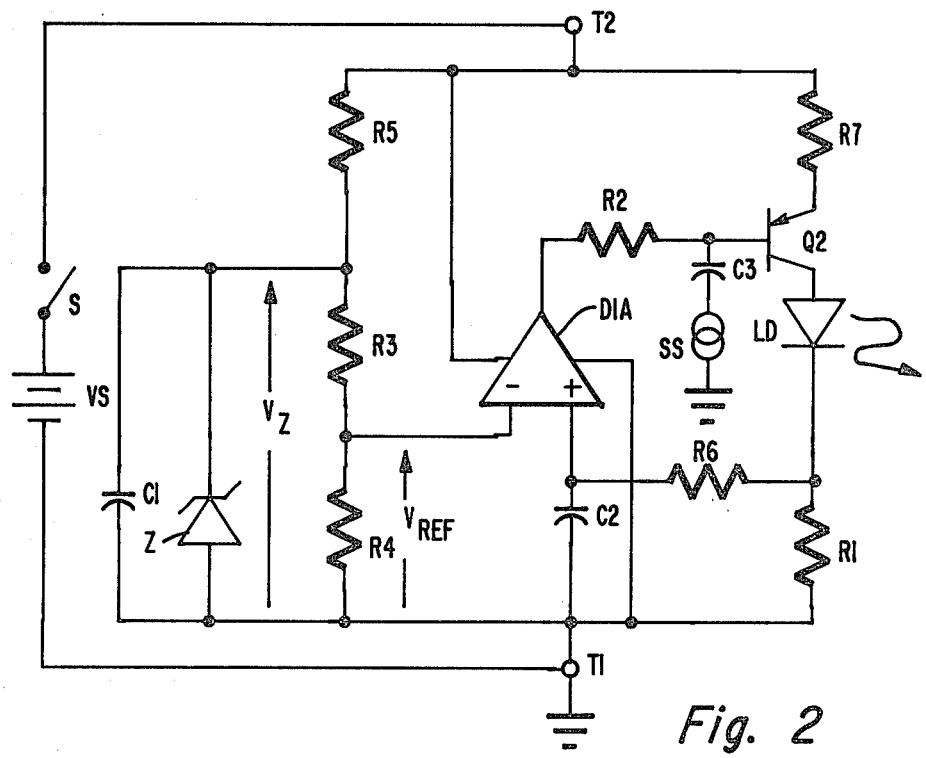
Figure 3:
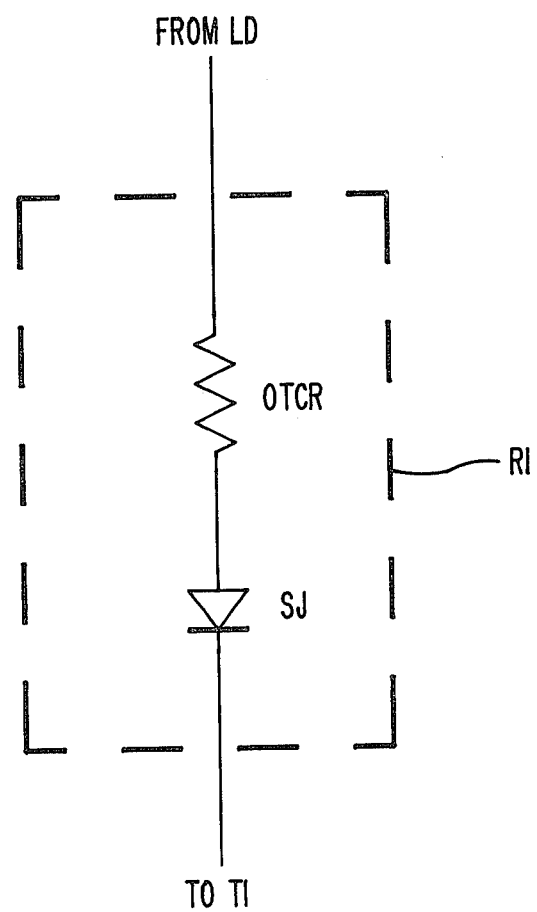

In the drawing:

FIGS. 1 and 2 are schematics of semiconductor laser diode biasing arrangements which embody the invention and employ a negative-temperature-coefficient resistance R1 thermally coupled to the laser diode LD; and FIG. 3 is a schematic of a representative embodiment of the negative-temperature-coefficient resistance R1 consisting of a forward poled semiconductor junction and a zero-temperature-coefficient resistor in series connection to conduct laser diode current, which semiconductor junction is thermally coupled to the laser diode.

When switch S is closed, the FIG. 1 circuitry establishes a bias current for forward biasing a semiconductor laser diode LD in the coherent light-emitting region above threshold region, but not so far above threshold region that the optical power generated will damage the facet of the diode. Diode LD is in series connection with the principal current conduction path of a transistor Q1, its collector-to-emitter path supposing it to be a bipolar transistor as shown, or its drain-to-source path were Q1 a field effect transistor. A voltage source VS shown as a battery, applies an operating potential between the first and second terminals, T1 and T2, when switch S is closed. A current sensing resistance, the resistor R1, has a first end connected at terminal T1 and has a second end connected to terminal T2 by the series connection of LD and the principal current conduction path of Q1. The voltage drop appearing across this current sensing resistance is equal to its resistance multiplied by the current flowing through Q1 and LD and thence through it.

A differential-input amplifier DIA senses the difference between the voltage drop across the current sensing resistance, R1, as applied to its inverting input connection and a reference voltage, $V_{REF}$, as applied to its non-inverting input connection for developing an error signal. This error signal is applied to the control electrode of Q1 for completing a feedback loop. This application is via a current limiting resistor R2 to the base electrode of Q1 where it is a bipolar type, as shown. With a lower transconductance field effect transistor for Q1 the output of DIA can be directly applied to its gate. The degenerative feedback loop that is thus completed adjusts the current flow through current sensing resistance R1 so that the voltage drop thereacross is substantially equal to $V_{REF}$. The current flow through the principal conduction path of Q1, through laser LD and thence through the current sensing resistance will, by Ohm's Law, be of value $V_{REF}$ divided by the current sensing resistance.

$V_{REF}$ can be developed in a variety of ways. The FIGURES show it being developed by potential division from the voltage $V_Z$ across a reverse-biased diode Z, using a resistive potential divider connection of resistors R3 and R4. Current flow through a bleeder resistor R5 biases diode Z into avalanche conduction during normal operation. During start-up, a shunt capacitor C1 slows the rate of voltage rise across the input of the resistive voltage divider comprising R3, R4 so there is no possibility of a current spike through LD prior to the feedback loop for regulating its current establishing its regulatory control. During normal operation capacitor C1 prevents noise generated by the avalanching of diode Z from being amplified by DIA to modulate laser LD current. The laser diode LD is normally operated in a controlled temperature environment. However, supposing $V_{REF}$ to be temperature stabilized, the current sensing resistance afforded by resistor R1 can be made to have a negative temperature coefficient and R1 can be thermally coupled to the laser diode LD, so light output is kept more constant with any change in laser operating temperature. A negative-temperature-coefficient current sensing resistance can be obtained by serially connecting a zero-temperature-coefficient resistor OTCR and a forward-poled semiconductor junction SJ thermally coupled to the laser diode LD. Using a negative-temperature-coefficient current sensing resistance presents less difficulty insofar as thermal coupling problems are concerned than the alternative of providing a negative-temperature-coefficient $V_{REF}$.

Adjustments for trimming laser current levels can be provided by replacing R3 and R4 with a potentiometer having tap connection through a current limiting resistor to the non-inverting input of DIA, which typically comprises an integrated-circuit operational amplifier. Or a trim rheostat can be inserted into the current sensing resistance in series with R1, which is less attractive to do where the sensing resistance temperature coefficient is of importance.

FIG. 2 shows the reversal of the differential input connections of amplifier DIA that must be made when the current sensing resistance is in the collector rather than the emitter circuit of the series regulator transistor. The series regulator transistor Q2 is PNP, rather than NPN, also. Laser diode LD can be in the collector or emitter circuit of the series regulator transistor in either the FIG. 1 or 2 configurations, although practical considerations arising from laser capacitances to its mounting structure and the potential of that structure, etc. may lead to one of the possible connections being preferable insofar as preventing current spikes through to the laser diode during start up conditions.

FIG. 2 also shows one of the ways the regulatory scheme of the invention can be adapted for modulated operation of laser diode LD. A low-pass filter section comprising resistor R6 and capacitor C2 filter the direct component of voltage drop across sensing resistance R1 for application to differential-input amplifier DIA input connection. Modulating signal from signal source SS is applied via blocking capacitor C3 to the base of Q2. Q2 is provided a linearizing emitter resistance R7 which reduces degenerative feedback loop gain somewhat, but if DIA is a high-gain operational amplifier, this will be acceptable. Alternatively, instead of applying signal to the base of Q2, Q2 emitter can be driven from a low source impedance with modulating signal, or $V_{REF}$ can be modulated.

It is preferable that the differential-input amplifier DIA be of a type that is operable even with its inputs biased close to one of its operating potentials (the more negative one in the circuits of FIGS. 1 and 2). This avoids the need for an auxiliary operating voltage supply, while regulation of laser diode current proceeds from lowest current levels. The CA 3140 operational amplifier manufactured by the Solid State Division of RCA Corporation in Somerville, NJ, is an example of such a differential-input amplifier.

What is claimed is:

1. In combination:
means for supplying an operating voltage between first and second terminals;
a semiconductor laser diode having a facet through which coherent light is emitted responsive to sufficiently large current flow through said laser diode, said coherent light undesirably tending to be of lessened intensity with increased temperature of said laser diode for given flow of current through said laser diode;
a transistor, having a principal current conduction path between first and second electrodes thereof, and having a third electrode the voltage between which and said first electrode controls the conduction of said principal current conduction path, the second electrode of said transistor being connected to said second terminal;
a differential-input amplifier having an output connection to the third electrode of said transistor, having a non-inverting input connection, and having an inverting input connection to which the first electrode of said transistor is connected through said laser diode, said laser diode being poled to conduct in forward direction the current flow through the principal current conduction path of said transistor;
means for applying a temperature-independent voltage between said first terminal and the non-inverting input connection of said differential-input amplifier; and
a negative-temperature-coefficient resistance connected between the inverting input connection of said differential-input amplifier and said first terminal, for conducting the flow of current through the principal current conduction path of said transistor and through said laser diode, and for sensing that flow to develop a voltage for direct-coupled application to the inverting input connection of said differential-input amplifier, the negative temperature coefficient of said resistance being such as to stabilize the intensity of coherent light emitted by said laser diode against variation with temperature and the value of such resistance at any temperature within the range of operation being of such value that the current through said laser diode causes substantial coherent light emission without incurring substantial damage, even cumulatively, to the laser diode facet.

2. In combination:
means for supplying an operating voltage between first and second terminals;
a semiconductor laser diode having a facet through which coherent light is emitted responsive to sufficiently large current flow through said laser diode, said coherent light undesirably tending to be of lessened intensity with increased temperature of said laser diode for given flow of current through said laser diode;
a transistor, having a principal current conduction path between first and second electrodes thereof, and having a third electrode the voltage between which and said first electrode controls the conduction of said principal current conduction path, the first electrode of said transistor being connected to said second terminal;
a differential-input amplifier having an output connection to the third electrode of said transistor, having an inverting input connection, and having a non-inverting input connection to which the second electrode of said transistor is connected through said laser diode, said laser diode being poled to conduct in forward direction the current flow through the principal current conduction path of said transistor;

means for applying a temperature-independent voltage between said first terminal and the inverting input connection of said differential-input amplifier; and a negative-temperature-coefficient resistance connected between the non-inverting input connection of said differential-input amplifier and said first terminal, for conducting the flow of current through the principal current conduction path of said transistor and through said laser diode, and for sensing that flow to develop a voltage for direct-coupled application to the non-inverting input connection of said differential-input amplifier, the negative temperature coefficient of said resistance being such as to stabilize the intensity of coherent light emitted by said laser diode against variation with temperature and the value of such resistance at any temperature within the range of operation being of such value that the current through said laser diode causes substantial coherent light emission without incurring substantial damage, even cumulatively, to the laser diode facet.

* * * * *